United States Patent [19]

Yagi

[11] Patent Number: 5,976,398
[45] Date of Patent: Nov. 2, 1999

[54] PROCESS FOR MANUFACTURING SEMICONDUCTOR, APPARATUS FOR MANUFACTURING SEMICONDUCTOR, AND AMORPHOUS MATERIAL

[75] Inventor: Shigeru Yagi, Minami-Ashigara, Japan

[73] Assignee: Fuji Xerox Co., Ltd., Tokyo, Japan

[21] Appl. No.: 08/922,595

[22] Filed: Sep. 3, 1997

[30] Foreign Application Priority Data

Sep. 4, 1996 [JP] Japan .................................... 8-233981
Sep. 4, 1996 [JP] Japan .................................... 8-233982

[51] Int. Cl.$^6$ .................................................. H01L 27/10
[52] U.S. Cl. ................................. 252/62.3 GA; 423/413; 501/40; 501/96.1; 501/96.4; 501/98.4; 438/96
[58] Field of Search .................. 423/413; 252/62.3 GA; 438/96, FOR 261, FOR 264, FOR 267, FOR 293; 501/40, 96.1, 96.4, 98.4

[56] References Cited

PUBLICATIONS

A. Yoshida, "Fabrication and characterization of InN and InAlN crystalline thin films by microwave–excited metalorganic vapor phase epitaxy", New Functionallity Materials, vol. C. 183–188 (1993).

S. Zembutsu et. al., "Growth of GaN single crystal films using electron cyclotron resonance plasma excited metalorganic vapor phase epitaxy", App. Phys. Lett. 48, 870–872 (Mar. 31, 1986).

H. Reuter et. al., "Properties of sputtered amorphous and microcrystalline GaAs films", Thin Solid Films, vol. 254, pp. 96–102 (1995).

M. Onuki et. al., "Time–of–Flight Measurement of Hydrogenated Amorphous GaP", Journal of Non–Crystalline Solids, 114 pp. 792–794 (1989).

U. Coscia et. al., "Photoconductivity of amorphous GaAs", Journal of Non–Crystalline Solids, 194 pp. 103–108 (1996).

J. Kouvetakis and D. B. Beach, "Chemical Vapor Deposition of Gallium Nitride from Diethylgallium Azide", Chemistry of Materials 1, 476–478 (1989).

Wang et al, "Infrared and Morphological Studies of Hydrogenated AlN Thin Films", Langmuir, vol. 8, pp. 1347–53, 1992 no month.

*Primary Examiner*—C. Melissa Koslow
*Attorney, Agent, or Firm*—Oliff & Berridge, PLC

[57] ABSTRACT

A process for manufacturing a semiconductor, including generating a first plasma of a V group element from a V group element source; generating a second plasma of an auxiliary material for activating a metal organic compound containing a III group element separately from and at the same time as the first plasma; adding the vaporized metal organic compound and the plasma of the auxiliary material to the plasma of the V group element; and forming, on a substrate, a film of a semiconductor compound containing the III group element and the V group element. A semiconductor and a semiconductor device having high quality and high functions can be manufactured in a short time at high yield. An amorphous material includes at least hydrogen, a III Group element, preferably gallium, and nitrogen. In the infrared absorption spectrum measured of the amorphous material, the ratio of the absorbance $I_{N-H}$, at the absorption peak indicating the bond (N—H) between nitrogen and hydrogen to that, $I_{C-H}$, at the absorption peak indicating the bond (C—H) between carbon and hydrogen is 2 or more; and the ratio of the absorbance, $I_{N-H}$, at the absorption peak indicating the bond (N—H) between nitrogen and hydrogen to the absorbance, $I_{III-H}$, at the absorption peak indicating the bond (III-H) between the III Group element and hydrogen is 0.2 or more.

11 Claims, 9 Drawing Sheets

F I G. 2
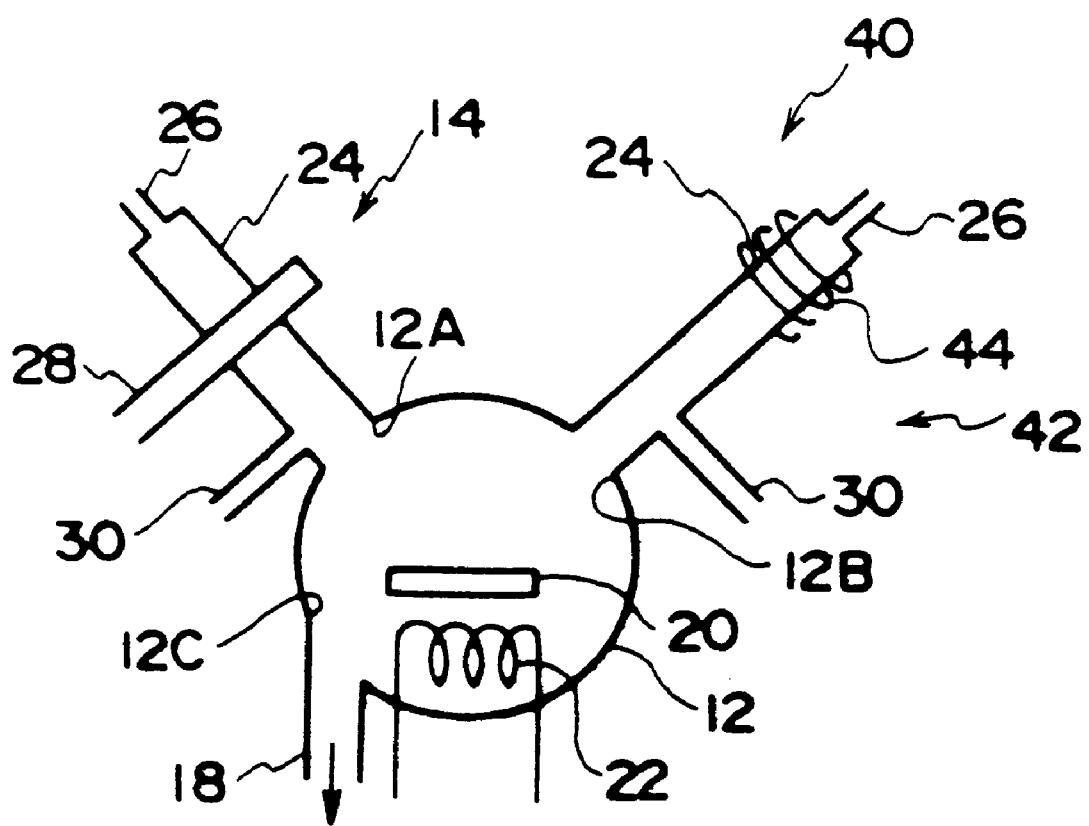

F I G. 3
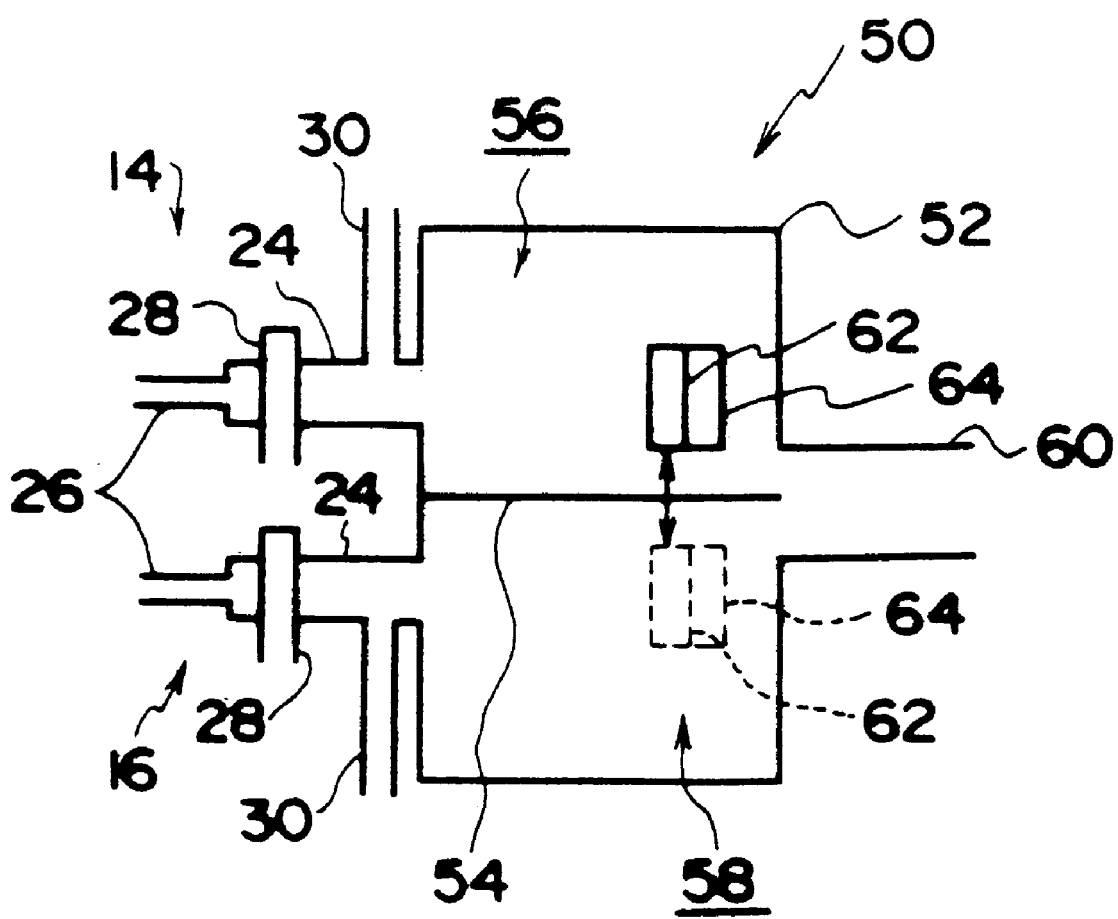

PROCESS FOR MANUFACTURING SEMICONDUCTOR, APPARATUS FOR MANUFACTURING SEMICONDUCTOR, AND AMORPHOUS MATERIAL

BACKGROUND OF THE INVENTION

1. Field of the Invention

This invention relates to a process for manufacturing a semiconductor, an apparatus for manufacturing a semiconductor, and an amorphous material suitable as a optical semiconductor for optoelectronics.

2. Description of Related Art

Wide bandgap semiconductor compounds, such as AlN, GaN, AlGaN, GaInN, InN, and the like have lately attracted considerable attention as materials applicable to blue LED, blue LD, and visible light emitters. $NH_3$ or $N_2$ is used as a V group element source in manufacturing these nitride type III-V (13-15: Group number defined by inorganic chemical nomenclature revised edition (1989) in IUPAC (International Union of Pure and Applied Chemistry)) semi-conductors. However, $NH_3$ and $N_2$ are more stable and inactive than other V group element sources such as $AsH_3$ and $PH_3$, which are used in manufacturing other III-V semiconductors. Therefore, the substrate temperature is adjusted to from 900 to 1,200° C. when forming a film of a nitride type III-V semiconductor compound on a substrate by metal organic chemical vapor deposition (MOCVD).

On the other hand, In (indium) is hardly incorporated into crystal at all, even at such a high temperature as 900 to 1,200° C., at which GaN of good quality grows. For this reason, the substrate temperature is lowered when manufacturing a mixed crystal containing In. However, with this method, film quality is sacrificed and it is difficult to prepare a mixed crystal of good quality containing 10% or more of In. Also, in a method involving changing the substrate temperature, it is difficult in practice to produce multilayer film type and superlattice type components and the like. The reason for this is that, when forming a film at high temperature on a film formed at low temperature, there is the risk of element diffusion and the like occuring in the film formed at low temperature.

As a method for lowering the growth temperature, disclosed are methods in which a plasma is formed of $N_2$ or $NH_3$ as a V group element source by radio frequency discharge, microwave discharge or electron-cyclotron resonance and a metal organic compound containing a III group element is introduced into the remote plasma to form a film (J. M. Van Hore et al, J. Cryst. Growth 150 (1995) 908, A. Yoshida, New Functionality materials, Vol. C. 183–188 (1993) and S. Zembutsu et al, App. Phys. Lett. 48, 870, 1986). As an apparatus for practicing this method, a semiconductor manufacturing apparatus is conventionally known which comprises a plasma generating means communicating with a reactor, a first supply means for supplying a V group element such as $N_2$ gas to the plasma generating means from the side opposite to the reactor, and a second supply means for supplying a metal organic compound containing a III group element to the reactor side of the plasma generating means.

When a mixed crystal is produced using this semiconductor manufacturing apparatus, mixed gas containing two or more metal organic compounds, for example, trimethylgallium and trimethylindium is supplied by the second supply means. However, when the mixed gas containing these metal organic compounds is introduced into plasma, either of these tends to be selectively decomposed since these metal organic compounds have different bond energies. Therefore, it is difficult to control the composition of the film to be produced even if the ratio of these compounds is controlled, and the resultant film contains carbon impurities derived from the metal organic compound that is more resistant to decomposition.

In addition, when laminating a film of different elements using the above apparatus for manufacturing a semiconductor, raw gas needs to be replaced. It takes from a few minutes to less than 20 minutes for the concentration of an active material to reach the desired value from the time at which raw gas is replaced. The film cannot be formed during that time.

On the other hand, with respect to an amorphous optical semiconductor, an amorphous chalcogenide compound such as selenium, tellurium, or the like is conventionally used as a photoelectric transfer material in camera tubes, receiving optics, photoreceptors and the like as described in "Fundamentals of amorphous semiconductors" published by Ohm Co., Ltd. Recently, hydrogenated amorphous silicon has been used in solar batteries, image sensors, thin film transistors, photoreceptors and the like.

The amorphous chalcogenide compound is, however, thermally unstable and tends to crystallize, so service conditions are limited and hence the valence electron is not well-controlled.

On the other hand, the valence electron of the hydrogenated amorphous silicon can be well-controlled so that the pn junction and the field effect at a boundary layer can be realized. Also, the hydrogenated amorphous silicon has enough thermal resistance to withstand temperatures of up to about 250° C. However, the photoconductivity of the hydrogenated amorphous silicon is weakened by intense light (Staebler and Wronski effect: Handbook of applied physics and the like). Therefore, the efficiency of the hydrogenated amorphous silicon may be reduced in use due to the deterioration caused by light during use in solar batteries and the like. Also, semiconductors composed of these elements, including crystals, are of an indirect transition type and hence there are limitations to their application. For example, they cannot be used in light emitters. Amorphous materials of the III-V compound semiconductors have been investigated as materials able to solve the problems of these amorphous materials.

The amorphous materials of III-V compound semiconductors are formed into a film either by processing a III-V crystal by vapor deposition or sputtering or by reacting an atomic III metal with a molecule or active molecule containing a V group element. Also, a metal organic compound containing a III metal and a metal organic compound containing a V metal are used to form a III-V compound film on a heated substrate (MOCVD). When a crystal film is formed on a substrate using these methods (at 600–1,000° C.), the substrate temperature is set to be lower than the above temperature in order to prepare an amorphous III-V compound. In this case, however, carbon derived from the organic metal remains in the film, and there is a large number of defect levels in the film, and the like and hence there is no amorphous III-V compound able to function as a photoelectric material (H. Reuter, et al, (Thin Solid Films), Vol. 254, pp.96–102 (1995)).

On the other hand, it is known that the density of defect levels between bands in amorphous silicon is reduced by hydrogenation, which allows the valence electron to be controlled. A III-V amorphous compound semiconductor is conventionally hydrogenated by reactive vapor deposition or reactive sputtering (M. Onuki et al, Journal of Non-crystalline Solids Vol. 114, pp.792–794 (1989); U. Coscia et al, Journal of Non-crystalline Solids Vol. 194, pp.103–108 (1996); and the like).

By the introduction of hydrogen, the passivation of dangling bonds is expected, the dangling bond being generated when a III atom and a V atom are combined with each other in a film and become amorphous. However, the resultant film may be sensitive to air so that oxidation tends to occur depending on the bond configuration with hydrogen and the amount of hydrogen introduced.

Also, when hydrogen is introduced for the III-V compound semiconductor, it is known that there is not only the problem with respect to the passivation of the unbonded bands, but also the fear that a dopant for pn control is inactivated in the case of crystal films. In the case of amorphous films, the content of hydrogen in the film and the bonding positions are factors to be considered as problems.

SUMMARY OF THE INVENTION

Accordingly, an object of the present invention is to improve the drawbacks of conventional processes and apparatuses for manufacturing a semiconductor and thereby to provide a process and apparatus for manufacturing a semiconductor able to produce semiconductors and semiconductor elements of high quality function in a short time and at high yield.

Another object of the present invention is to improve the drawbacks of amorphous III-V compound semiconductors, to make use of the functions of hydrogen in amorphous semiconductors, and to provide a new, cheap amorphous material which has excellent photoconductivity and high-speed response, which changes little over time, which has environmentally resistant characteristics and heat resistance, which is optically active, and which is suitable as an optoelectronic material.

Still another object of the present invention is to provide especially an amorphous nitride III-V compound semiconductor.

A further object of the present invention is to provide a novel optical semiconductor which can be manufactured safely, is inexpensive, and has high functions.

After a lot of hard work, the present inventors have found that the above objects can be attained by controlling the film forming steps and the reaction steps using plasma, and the invention was completed.

A first aspect of the present invention is a process for manufacturing a semiconductor, comprising:

a first plasma generating step of generating plasma of a V group element from a V group element source;

a second plasma generating step of generating plasma of an auxiliary material for activating a metal organic compound containing a III group element separately from and at the same time as the first plasma generating step;

an addition step of adding the vaporized metal organic compound and the plasma of the auxiliary material to the plasma of the V group element; and a film forming step of forming, on a substrate, a film of a semiconductor compound containing the III group element and V group element.

A second aspect of the present invention is a process for manufacturing a semiconductor, comprising:

a first plasma generating step of generating plasma of a V group element from a V group element source;

a first addition step of adding a vaporized metal organic compound containing a III group element to the plasma generated in the first plasma generating step;

a second plasma generating step of generating plasma of a V group element from a V group element source separately from and at the same time as the first plasma generating step;

a second addition step of adding a vaporized metal organic compound containing a III group element different from the III group element used in the first addition step to the plasma generated in the second plasma generating step; and a film forming step of forming, on a substrate, a film of a mixed crystal of the semiconductor compound containing the III group element added in the first addition step and the V group element used in the first plasma generating step and a semiconductor compound containing the III group element added in the second addition step and the V group element used in the second plasma generating step.

A third aspect of the present invention is an apparatus for manufacturing a semiconductor, comprising:

a reactor in which a semiconductor film is formed on a substrate;

a heat and support means for supporting and heating the substrate, the heat and support means being installed in the reactor;

a plurality of first supply means for supplying a first gas to be formed into plasma;

a plurality of plasma generating means for generating plasma of the first gas, the plurality of plasma generating means communicated with each of the plurality of first supply means and the reactor; and a plurality of second supply means for supplying a second raw gas to the reactor side of each of the plurality of plasma generating means.

In the present invention having the above structure, a semiconductor and semiconductor device possessing high quality and high functions can be produced in a short time at high yield.

On the other hand, it was confirmed that the conventional drawbacks of an amorphous III-V nitride compound semiconductor can be improved by controlling the bonding condition of an element and hydrogen contained in a film. Thus, a fourth aspect of the present invention was completed.

Specifically, a fourth aspect of the present invention is an amorphous material comprising at least hydrogen, a III group element, and nitrogen, wherein, in the infrared absorption spectrum measured of the amorphous material, the ratio of the absorbance, $I_{N-H}$, at the absorption peak indicating the bond (N—H) between nitrogen and hydrogen to that, $I_{C-H}$, at the absorption peak indicating the bond(C—H) between carbon and hydrogen (hereinafter called "the absorbance ratio $I_{N-H}/I_{C-H}$") is 2 or more; and the ratio of the absorbance, $I_{N-H}$, at the absorption peak indicating the bond (N—H) between nitrogen and hydrogen to that, $I_{III-H}$, at the absorption peak indicating the bond(III-H) between a III Group element and hydrogen (hereinafter called "the absorbance ratio $I_{N-H}/I_{III-H}$") is 0.2 or more.

For example, in the case of using gallium (Ga) as the III group element, the absorption peaks by the stretching vibrations of N—H, C—H and Ga—H bonds in the amorphous material are observed in the vicinities of 3230 cm$^{-1}$, 2950 cm$^{-1}$ and 2100 to 2140 cm$^{-1}$ respectively. The absorbance ratio $I_{N-H}/I_{C-H}$ (specifically, $I_{3230}/I_{2950}$) should be 2 or more.

Moreover, the absorbance ratio $I_{N-H}/I_{III-H}$ (specifically, $I_{3230}/I_{2100}$) should be 0.2 or more.

The intensities of these absorption peaks depend on the raw materials of the amorphous materials and the manufacturing processes. To control the ratios of these intensities in the above defined ranges can provide the following merits. Specifically, the ratios of the III group element and nitrogen to hydrogen are appropriately kept to ensure a good bonding condition. Also, the amount of carbon existing in the amorphous material is reduced and preferably less than the detection limit, whereby the proportion of elements in the amorphous material becomes appropriate so that the resultant amorphous material exhibits stable and high performances.

The amorphous material of the present invention improves the drawbacks of conventional III-V compound semiconductors and has excellent photoconductivity and high-speed response; is stable over time; and has environmentally resistant characteristics and heat resistance.

BRIEF DESCRIPTION OF THE DRAWINGS

FIG. 2 is a schematically structural view of an apparatus for manufacturing a semiconductor according to the second embodiment of the present invention.

FIG. 3 is a schematically structural view of an apparatus for manufacturing a semiconductor according to the third embodiment of the present invention.

DETAIL DESCRIPTION OF THE PREFERRED EMBODIMENTS

The present invention will now be explained in detail.

Figure 1:
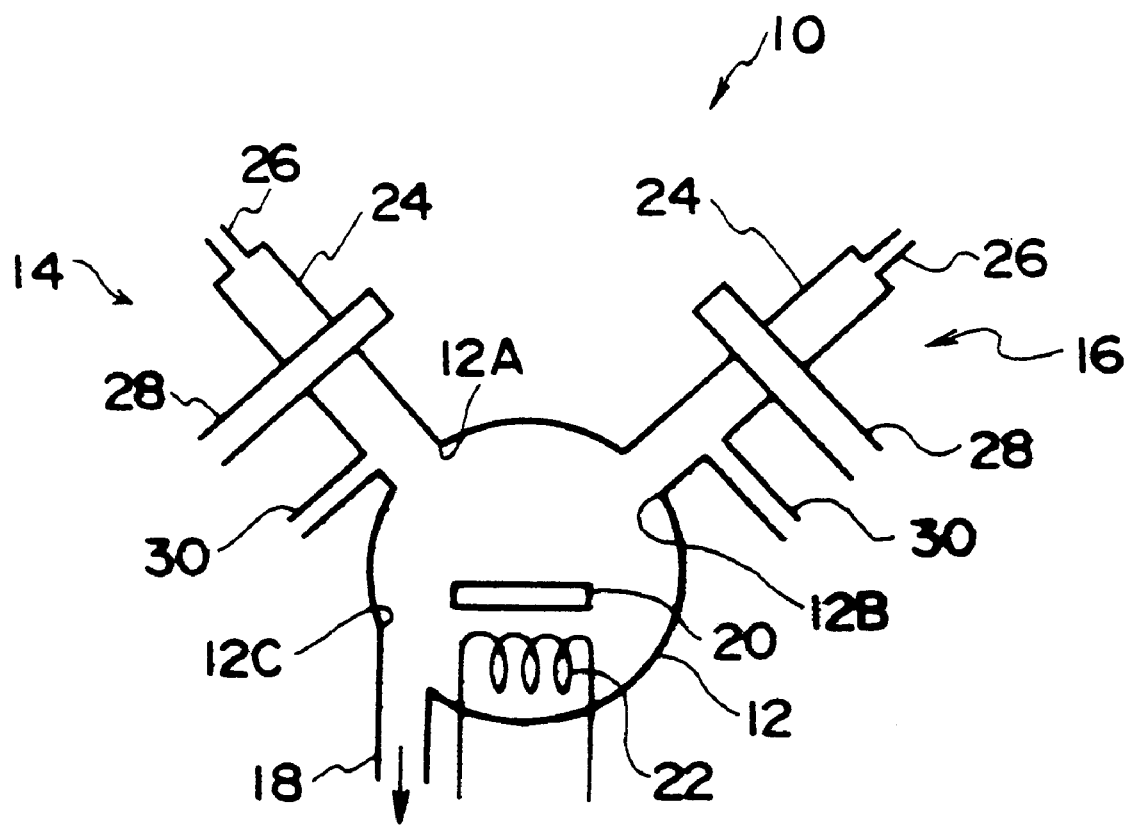
FIG. 1 is a schematically structural view of an apparatus for manufacturing a semiconductor according to the first embodiment of the present invention.

FIG. 1 shows a schematical structure of a semiconductor manufacturing apparatus 10 according to the first embodiment of the present invention. The semiconductor manufacturing apparatus 10 comprises a cylindrical reactor 12; a first and second raw material activation-supply portions 14, 16 communicated with the reactor 12 via openings 12A, 12B respectively; an exhaust pipe 18 for evacuating the gas in the reactor 12, the exhaust pipe 18 being communicated with the reactor 12 via an opening 12C; a substrate holder 20 for holding a substrate, the substrate holder 20 being installed in the reactor 12; and a heater 22 disposed on the substrate holder 20 at the side opposite to the side on which the substrate is placed.

The first and second raw material activation-supply portions 14, 16 have the same structures as each other and each comprises a cylindrical quartz pipe 24 communicated with the reactor 12 and externally disposed on the reactor 12 in a radial direction; a gas introducing pipe 26 communicated with the quartz pipe 24 at the side opposite to the reactor 12; a microwave waveguide 28 disposed so as to cross the quartz pipe 24; and a gas introducing pipe 30 communicated with the quartz pipe 24 at the position closer to the reactor 12 than the cross position of the microwave waveguide 28 and the quartz pipe 24. The microwave waveguide 28 has a rectangular frame body, through which the quartz pipe 24 penetrates.

The gas introducing pipe 26, 30 of each of the first and second raw material activation-supply portions 14, 16 are respectively communicated with gas cylinders (not shown) or the like used as a raw material supplying means. Also, the microwave waveguide 28 is connected with a microwave oscillator using a magnetron, though not shown, and causes discharge in the quartz pipe 24. Further, the exhaust pipe 30 is communicated with a pump (not shown) used as a evacuating means, which produces a near vacuum in the reactor 12.

FIG. 2 shows a semiconductor manufacturing apparatus 40 according to the second embodiment of the present invention. In the semiconductor manufacturing apparatuses according to the second embodiment and to the succeeding embodiments, the same parts as in the semiconductor manufacturing apparatus 10 according to the first embodiment are represented by the same symbols and detailed explanations are omitted.

The semiconductor manufacturing apparatus 40 comprises a second raw material activation-supply portion 42 instead of the second raw material activation-supply portion 16 in the semiconductor manufacturing apparatus 10. In the second raw material activation-supply portion 42, a radio frequency coil 44 is used instead of the microwave waveguide 28. The radio frequency coil 44 is wound on the outer periphery of a quartz pipe 24 and connected to a radio frequency oscillator, which is not shown.

In the semiconductor manufacturing apparatuses 10 and 40, a V group element source is supplied, for example, from the gas introducing pipe 26 of the first raw material activation-supply portion 14; a metal organic compound containing a III group element is supplied from the gas introducing pipe 30 of the first raw material activation-supply portion 14, and an auxiliary material, which activates the metal organic compound so that an organic functional group of the metal organic compound is decomposed or reacted and inactivated in the reaction system, is supplied from the gas introducing pipe 26 of the second raw material activation-supply portion 16 or 42. Also, for example, a V group element source is supplied from the gas introducing pipe 26 of the first and second raw material activation-supply portions 14, and 16 or 42 and metal organic compounds containing III group elements of different types are supplied from the gas introducing pipe 30 of the first and second raw material activation-supply portions 14, and 16 or 42. The discharge condition and the flow rate can be altered in each of the raw material activation-supply portions to change the activating condition for the V group element corresponding to the bond energy of each of the metal organic compounds. Accordingly, using these semiconductor manufacturing apparatuses 10 or 40, a film having less impurities and a mixed crystal film of high quality can be produced.

FIG. 3 shows a semiconductor manufacturing apparatus 50 according to the third embodiment of the present invention. The semiconductor manufacturing apparatus 50 includes a reactor 52 formed of a rectangular frame body. In the reactor 52, a plate type dividing wall 54 equipped with a gate valve is disposed so as to divide the space of the reactor 52 into two equal parts. Also, the semiconductor manufacturing apparatus 50 comprises a first raw material activation-supply portion 14 communicated with the reactor 52 at a first space 56 divided by the dividing wall 54; a second raw material activation-supply portion 16 disposed at the same side as the first raw material activation-supply portion 14 and communicated with the reactor 52 at a second space 58 divided by the dividing wall 54; an exhaust pipe 60 located on the side opposite to the first and second raw material activation-supply portions 14, 16 and communicated the reactors 52 so as to communicate with both of the first and second spaces 56, 58; a substrate holder 62 for holding a substrate, the substrate holder 62 being disposed in the reactor 52; and a heater 64 disposed on the substrate holder 62 at the side opposite to the side on which the substrate is disposed. The substrate holder 62 and the heater 64 can be moved in unison between the first space 56 and the second space 58 via the gate valve of the dividing wall 54 by a transfer means (not shown).

Figure 4:
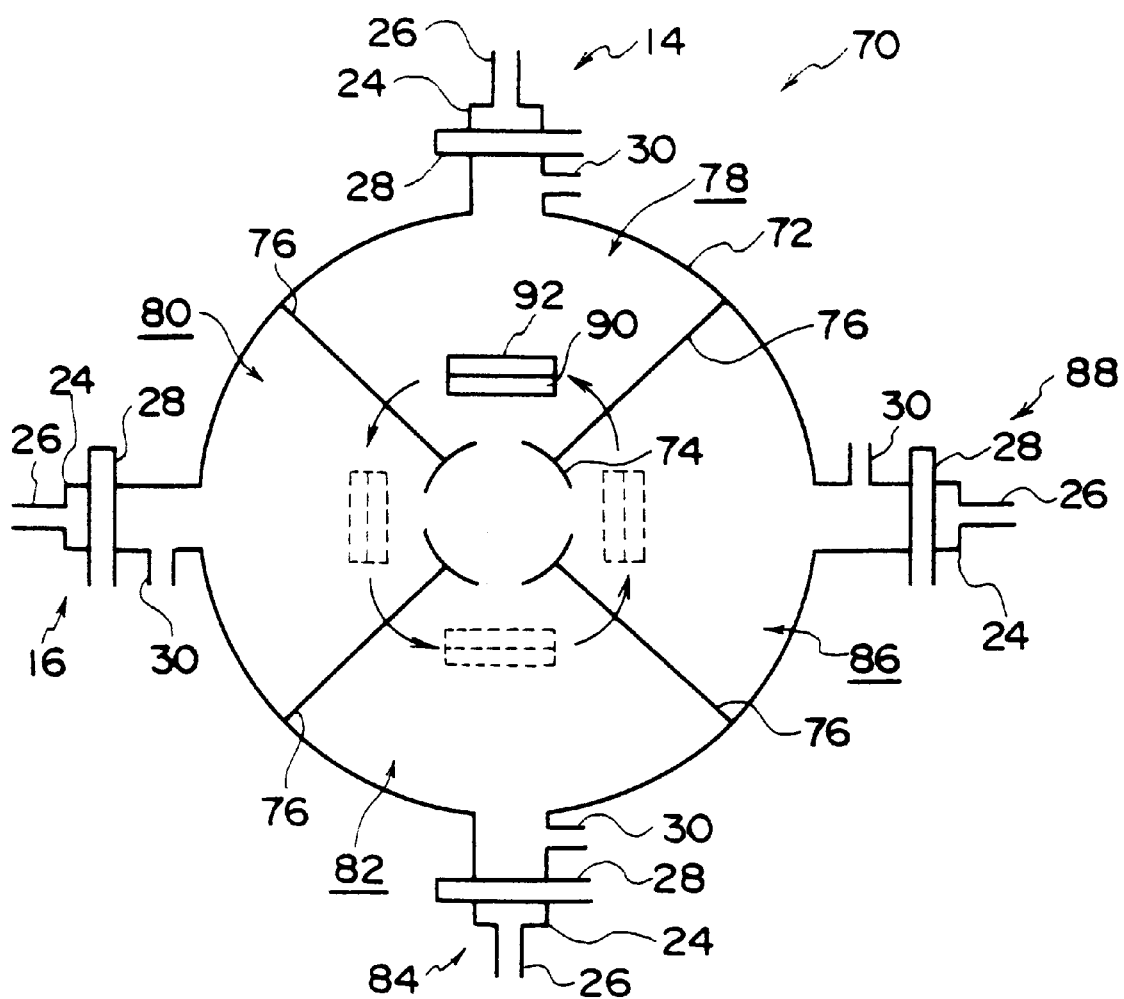
FIG. 4 is a schematically structural view of an apparatus for manufacturing a semiconductor according to the fourth embodiment of the present invention.

FIG. 4 shows a semiconductor manufacturing apparatus 70 according to the fourth embodiment of the present invention. The semiconductor manufacturing apparatus 70 has a cylindrical reactor 72. A circular hole (not shown) is formed in the center of each of the ends of the reactor 72 (not shown). An exhaust pipe 74 penetrates from this circular hole and is installed along the same axis as the reactor 72. The space between the reactor 72 and the exhaust pipe 74 is sealed with a resin or the like. In the exhaust pipe 74, four slits are formed along the axis at equal intervals. The air in the reactor 72 is evacuated from these slits.

In the reactor 72, a plate type four dividing walls 76 equipped with a gate valve are disposed in a radial direction so as to divide the space of the reactor 72 into four equal parts and to dispose each slit of the exhaust pipe 74 in each space. Also, the semiconductor manufacturing apparatus 70 comprises a first raw material activation-supply portion 14 communicated with a first space 78 divided by the two dividing walls 76; a second raw material activation-supply portion 16 communicated with a second space 80 divided by the two dividing walls 76; a third raw material activation-supply portion 84 communicated with a third space 82 divided by the two dividing walls 76; a fourth raw material activation-supply portion 88 communicated with a fourth space 86 divided by the two dividing walls 76; a substrate holder 92 for holding a substrate, the substrate holder 92 being disposed in the reactor 72; and a heater 90 disposed on the substrate holder 92 at the side opposite to the side on which the substrate is disposed. The substrate holder 92 and the heater 90 can be moved in unison from the first space 78 to the fourth space 86 via the gate valve of the dividing wall 76 by a transfer means (not shown).

The structures of the third and fourth raw material activation-supply portions 84, 88 are the same as those of the first and second raw material activation-supply portions 14, 16. Therefore, explanations about these are omitted.

In the above semiconductor manufacturing apparatuses 50 and 70, activating conditions such as a discharge power, flow rate of the activating raw material, flow rate of the III group metal organic compound gas, and the like in each of the spaces can be altered. When films having different compositions are formed or the like, the substrate holder and the heater are allowed to move to the adjacent space via the gate valve formed in each of the dividing walls, whereby a film can be continuously formed, resulting in a reduction in time for manufacturing a semiconductor.

An amorphous material of the present invention, which is suitable for optical semiconductors, can be manufactured by the following process.

Figure 5:
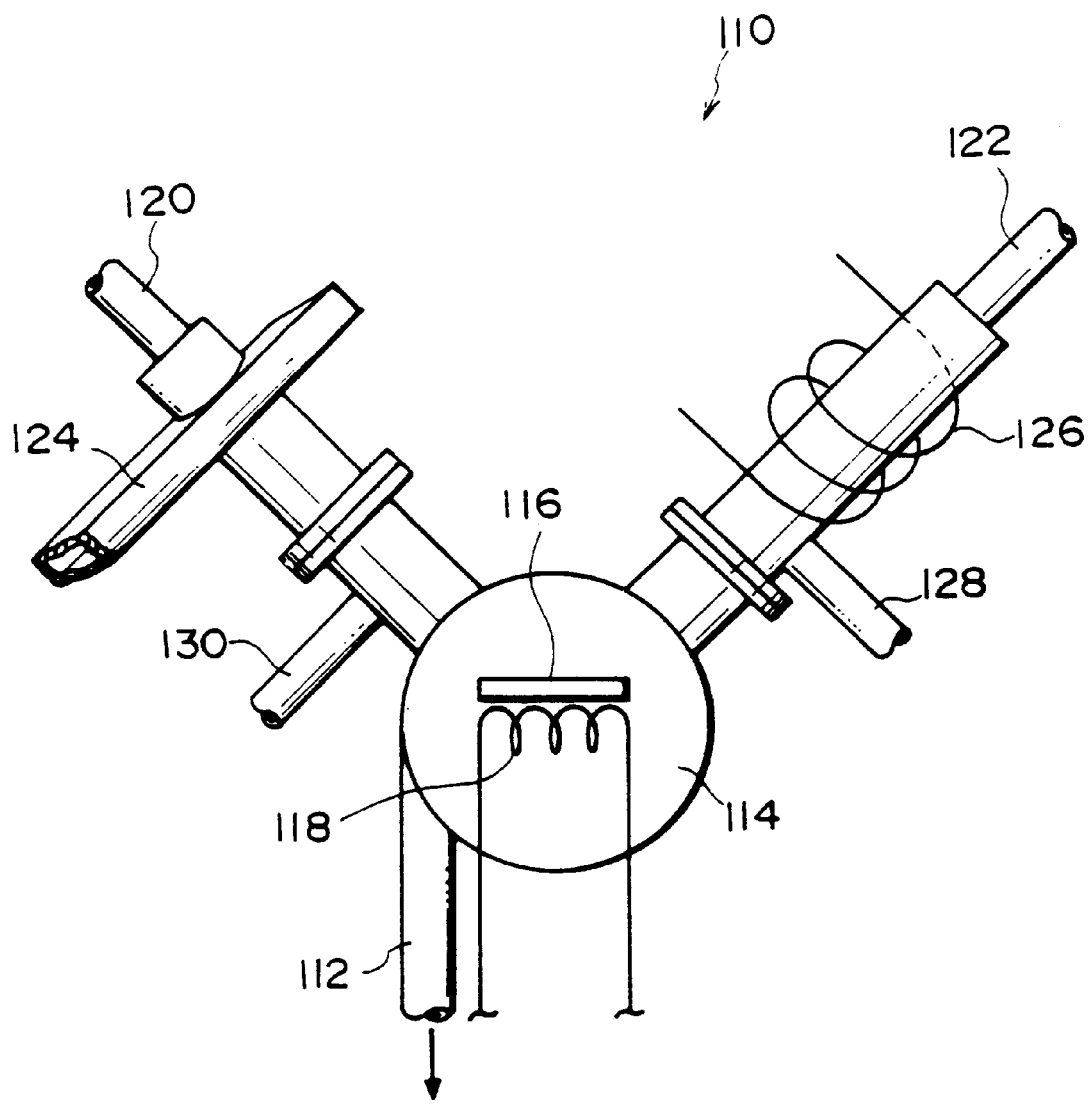
FIG. 5 is a schematic view showing an apparatus for manufacturing a semiconductor, which can be used for manufacturing the amorphous material of the present invention.

FIG. 5 is a conceptual view of a semiconductor manufacturing apparatus suitable for manufacturing the amorphous material of the present invention. This semiconductor manufacturing apparatus is applied to a process in which plasma is utilized as an activating means. A semiconductor manufacturing apparatus 110 shown in FIG. comprises a substrate holder 116 and a heater 118 for heating a substrate, which are disposed in a reactor 114 provided with a vent hole 112 and allowed to form a vacuum. Quartz pipes (hereinafter called "gas introducing pipe" as the case may be) 120, 122 for introducing gas into the reactor 114 are connected with the reactor 114.

Using $N_2$ gas as a nitrogen source, $N_2$ gas is introduced into the reactor 114 from the gas introducing pipe 120. The gas introducing pipe 120 is provided with a microwave waveguide 124 connected with a microwave oscillator using a magnetron. 2.45 GHz microwaves are supplied to the microwave waveguide 124, whereby the discharge is induced in the gas introducing pipe (quartz pipe) 120. The discharge allows $N_2$ gas in the gas introducing pipe 120 to be activated.

On the other hand, $H_2$, for example, is introduced through another gas introducing pipe 122. This gas introducing pipe 122 is provided with a radio frequency coil 126 for supplying radio frequency from a radio frequency oscillator to the gas introducing pipe 122. 13.56 MHz radio frequency are supplied to the radio frequency coil 126, whereby the discharge is induced in the gas introducing pipe (quartz pipe) 122. Also, trimethylgallium is introduced into the gas introducing pipe 122 from a third gas introducing pipe 128 located at the downstream of a discharge space. Materials which are activated by microwaves or radio frequency in each of the gas introducing pipes 120, 122 are introduced into the reactor 114 and amorphous gallium nitride is formed on the substrate there.

As an activating method in the raw material activation-supply portion in the embodiments of the present invention, any one of a radio frequency discharge method, microwave discharge method, electron-cyclotron resonance method, and helicon plasma method may be used. Also, these methods may be used either independently or in combinations of two or more. In addition, if the radio frequency discharge method is used, both the inductive coupling-type and the volume-type like the second embodiment may be used.

When two activating methods are used in one space, the two discharges must be produced under the same pressure and at the same time. A difference between the pressures in the microwave waveguide (or radio frequency guide) and the quartz pipe (or reactor) may be made. When these pressures are the same, different means for activating raw materials, such as microwave discharge and radio frequency discharge are used so that the excitation energy of an active species can be greatly altered, in order to control the film quality.

In the third and fourth embodiments, one raw material activation-supply portion is communicated with the space divided by the dividing wall. However, two or more raw material activation-supply portions may be connected with one space to produce a mixed crystal in each space.

In the above embodiments, the substrate temperature is from 20° C. to 1,200° C., preferably from 100° C. to 1,000°

C., and may be altered to a temperature appropriate to the object. When making gallium nitride, an amorphous film can be formed when the substrate temperature is low (from 20° C. to 400° C.) A crystal film can be formed when the substrate temperature is high (400° C. to 1,000° C.), and a polycrystal film can be formed when the substrate temperature is medium (300° C. to 400° C.).

The substrate temperature for forming an amorphous film is preferably from 20° C. to 400° C., and more preferably from 200° C. to 400° C. The molar ratio of the III group element source containing a III group element and the V compound such as nitrogen or the like is from 1:50000 to 1:50 and preferably from 1:10000 to 1:200. The molar ratio of the V group element such as nitrogen and the auxiliary material such as hydrogen is from 1:0 to 1:100, preferably from 1:0 to 1:10. It is preferable that the film growing rate be in a range of from 0.1 to 10 μm/h and the inner pressure in in the reactor be in a range of from $5 \times 10^{-4}$ to $2 \times 10^{-2}$ Pa.

The preferred content of a hydrogen atom in the amorphous film to be formed is 1 to 50 atomic %. Also, the bandgap is 1.9 to 6.5 eV and the film thickness is 0.001 to 50 μm. Further, the light conductivity (light resistance) and the dark conductivity (dark resistance) are $10^2$ to $10^8$ Ωcm and $10^6$ to $10^{16}$ Ωcm respectively.

The amorphous semiconductor containing hydrogen is a photoconductive film with a high ratio of light to dark resistance because unbonded bonds of elements in the film are coupled by the introduced hydrogen so that a so called charge trap is reduced. The amorphous semiconductor containing hydrogen has a resistance higher than that of the crystal semiconductor and hence has a high electric field therein. Therefore, a thin-film LED device, display, and the like which are produced by combining the amorphous semiconductor with a transparent electrode or the like are useful for a large area thin-film device.

On the other hand, the substrate temperature is designed to be high and/or the amount of the III group element source containing a III group element is designed to be small, whereby a microcrystal or mixed crystal which contain two kinds of III group elements can be excellently formed. The substrate temperature in this case is preferably from 300° C. to 1,200° C. Particularly, a microcrystal tends to be formed at lower temperatures. The more preferable substrate temperature is in a range of from 400° C. to 1100° C. The molar ratio of the III group element source containing a III group element and the V group compound such as nitrogen or the like is from 1:100000 to 1:1000 and preferably from 1:5000 to 1:1000. It is preferable that the film growing rate be in a range of from 0.05 to 5 μm/h and the inner pressure in the reactor be in a range of from $5 \times 10^{-4}$ to $2 \times 10^{-2}$Pa.

Also, the bandgap is 1.9 to 6.5 eV and the film thickness is 0.001 to 50 μm. Further, the light conductivity (light resistance) and the dark conductivity (dark resistance) are $10^{-2}$ to $10^2$ Ωcm and $10^{-2}$ to $10^6$ Ωcm respectively.

The microcrystal or crystal semiconductor has low resistance and can be driven by a relatively low current. Therefore, the semiconductors of these types are useful as a solid device such as a LED, a laser device and the like.

The substrate used in the present invention may be an electrically conductive material or an insulating material and may be a crystal material or an amorphous material. Examples of electroconductive substrates include metals such as aluminum, stainless steel, nickel, chromium, and alloy crystals of these, and semiconductors or monocrystals such as Si, GaAs, SiC, sapphire, and the like.

Also, examples of insulating substrates include a high polymer film, glass, ceramics, and the like. The insulating substrate may be processed by electroconductive treatment for forming a film using the above metal or gold, silver, copper, or the like by vapor deposition, sputtering, ion-plating, or the like.

Examples of a material used for a support, through which light can pass, of a transparent electroconductive substrate which enables input and output of light include transparent inorganic materials such as glass, quartz, sapphire, and the like; films or plates of transparent organic resins such as a fluorine-contained resin, polyester, polycarbonate, polyethylene, polyethylene terephthalate, epoxy resin, and the like; optical fiber, SELFOC optical plate, and the like.

Examples of an electrode, through which light can pass, formed on the above support include electrodes formed by processing a transparent electroconductive material, such as ITO, zinc oxide, tin oxide, lead oxide, indium oxide, copper iodide, or the like, by vapor deposition, ion plating, sputtering, or the like; and electrodes which are formed using a metal such as Al, Ni, Au, or the like by vapor deposition or sputtering so thinly that they reach a translucent level (a level which does not spoil transmittancy).

As the V group element source which is introduced from either the gas introducing pipe 26 or the gas introducing pipe 120, nitrogen-containing vapor (or a liquid which can be vaporized in use) such as $N_2$, $NH_3$, $NF_3$, $N_2H_4$, monomethylhydrazine, dimethylhydrazine, or the like; or a mixed gas produced by bubbling these compounds using a carrier gas can be used. Also, $PH_3$, $P(C_4H_9)_3$, $AsH_3$, or $AsH_2C(CH_3)_3$ may be used. Further, these V group element sources may be used either singly or in combinations of two or more.

Examples of the carrier gas include rare gases such as He, Ar, Ne, and the like; mono-element gases such as $H_2$, $N_2$, and the like; hydrocarbons such as methane, ethane, and the like; and carbon halides such as $CF_4$, $C_2F_6$, and the like.

It is desirable that the III group element which is a raw material of the amorphous material suitable as an optical device material be selected from a group consisting of Al, Ga, and In.

As the raw material for a III group element source, other than a III group element itself, a metal organic compound containing one or more III group elements may be used. Given as examples of the metal organic compound are trimethylaluminum, triethylaluminum, tert-butylaluminum, trimethylgallium, triethylgallium, tert-butylgallium, trimethylindium, triethylindium, tert-butylindium, and the like, which may be either liquid or solid. These liquid or solid compounds are vaporized and used as they are or as a mixed gas bubbled in the above carrier gas.

As the auxiliary material, which reacts with an organic functional group of the metal organic compound including the III group element to inactivate the organic functional group in the reaction system, rare gases such as He, Ne, Ar, and the like, $H_2$, and halogen gases such as $Cl_2$, $F_2$, and the like may be used either singly or in combinations of two or more. Also, these auxiliary materials maybe used after being mixed with the V group element source. The auxiliary material may be used as required to control the energy for the active species or to inactivate an organic functional group and thereby to prevent film defects.

Also, elements for p, n control can be introduced, for example, from th e gas introducing pipe 30 to dope the film with these elements.

Examples of elements used as the n-type element include Li of the I A group (group 1, defined by inorganic chemical nomenclature revised edition (1989) in IUPAC); Cu, Ag, and Au of the I B group (group 11, defined by inorganic chemical nomenclature revised edition (1989) in IUPAC); Mg of II A group (group 2, defined by inorganic chemical nomenclature revised edition (1989) in IUPAC); Zn of the II B group (group 12, defined by inorganic chemical nomenclature revised edition (1989) in IUPAC); Si, Ge, Sn, and Pb of the IV A group (group 14, defined by inorganic chemical nomenclature revised edition (1989) in IUPAC); and S, Se, and Te of the VIA group (group 16, defined by inorganic chemical nomenclature revised edition (1989) in IUPAC). Among these, Si, Ge, and Sn are desirable in view of a charge carrier control.

Examples of elements used as the p-type element include Li and Na of the I A group; Cu, Ag, and Au of the I B group; Be, Mg, Ca, Sr, Ba, and Ra of the II A group; Zn, Cd, and Hg of the II B group; C, Si, Ge, Sn, and Pb of the IV A group; Cr of the VI B group (group 6, defined by inorganic chemical nomenclature revised edition (1989) in IUPAC); Fe of the VIII group (group 8, defined by inorganic chemical nomenclature revised edition (1989) in IUPAC); Co (group 9, defined by inorganic chemical nomenclature revised edition (1989) in IUPAC); Ni (group 10, defined by inorganic chemical nomenclature revised edition (1989) in IUPAC); and the like. Among these, Be, Mg, Ca, Zn, and Sr are desirable in view of charge carrier control.

In the doping method, $SiH_4$, $Si_2H_6$, $GeH_4$, $GeF_4$, or $SnH_4$ for the n-type and $BeH_2$, $BeCl_2$, $BeCl_4$, cyclopentadienylmagnesium, dimethylcalcium, dimethylstrontium, dimethylzinc, diethylzinc, or the like for the p-type can be used in a gaseous state. These compounds may be diffused in a film as an element or incorporated into a film as an ion.

Using such an amorphous material containing one or more III group elements selected from a group consisting of Al, Ga, and In and nitrogen, the band gap can be varied corresponding to color regions ranging from the red to the UV region. Also, because this amorphous material has high light transmittance, low dark conductivity, and high light sensitivity, a wide range of light from visible light to UV light can be efficiently utilized. Further, this amorphous material is superior in light resistance, heat resistance, and oxidation resistance, possesses high-speed response, and has also the light emitting function, in all wave length ranges which is never obtained by conventional amorphous materials. Therefore, this amorphous material can be used for a hybrid device in which an electronic device is combined with an emitting device. Specifically, the amorphous material can be used for a highly efficient solar battery, high speed TFT, highly sensitive avalanche photosensor, large area LED, full-color display, light modulation device, photointerconnect device, and the like. Also, the amorphous material can be used as a buffer layer for crystal layers, a charge injection inhibition layer, an insulating layer, and the like.

Figure 6:
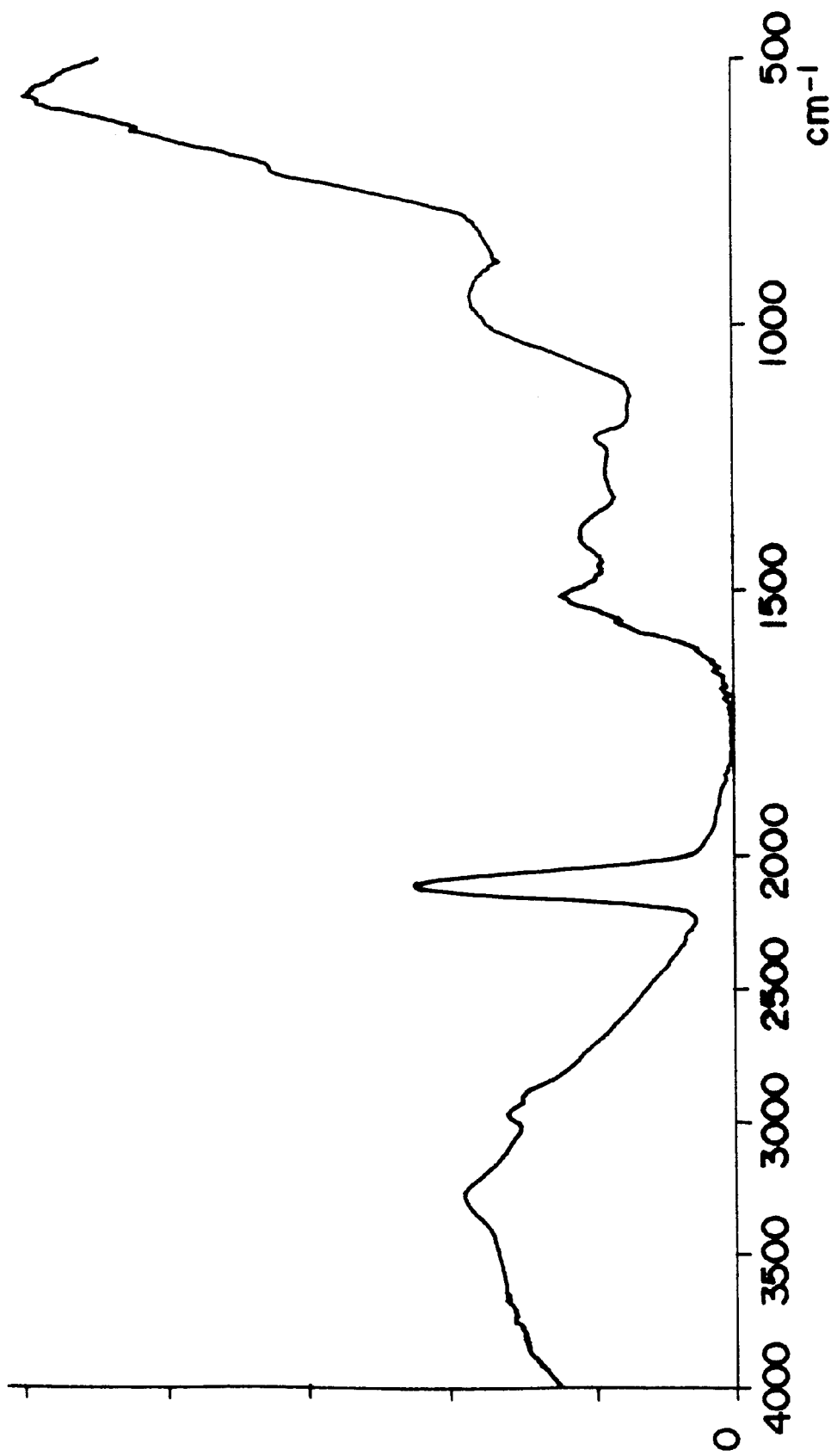
FIG. 6 is a graph showing the model IR spectrum of the amorphous material of the present invention.

FIG. 6 is a graph showing an example of the IR spectrum of a film formed on a Si wafer. Here, as gallium is used as the III group element in this spectrum, the absorption peak by the stretching vibrations of N—H is observed in the vicinity of 3230 $cm^{-1}$ and the absorption peak by the stretching vibrations of Ga—H is observed in the vicinity of 2100 $cm^{-1}$. Also, the absorption peak by the stretching vibrations of C—H is observed in the vicinity of 2950 $cm^{-1}$. The intensities of these absorption peaks vary depending on the discharge power, flow rate of the metal organic compound containing the III group element, flow rate and pressure of a compound containing the V group element, and kind, amount, and the like of the raw material used as an auxiliary material when using the auxiliary material.

As the absorption intensity of the infrared spectrum, an intensity in which the background is corrected is used. The ratio of the absorption intensity of the absorption peak in the vicinity of 3230 $cm^{-1}$ to the absorption intensity of the absorption peak in the vicinity of 2100 $cm^{-1}$ can be represented by $I_{3230}/I_{2100}$, which means $I_{N-H}/I_{III-H}$. Also, the infrared absorbance ratio of the absorption intensity at 3230 $cm^{-1}$ to the absorption intensity at 2950 $cm^{-1}$ is shown by $I_{3230}/I_{2950}$, which means $I_{N-H}/I_{C-H}$. The amorphous III-V nitride compound semiconductor (that is, Ga—N semiconductor) having the absorbance ratio $I_{N-H}/I_{C-H}$ (specifically, $I_{3230}/I_{2950}$) of 2 or more and the absorbance ratio $I_{N-H}/I_{III-H}$ (specifically, $I_{3230}/I_{2100}$) of 0.2 or more is stable. The infrared absorption spectrum of such a film never changes even when the film is allowed to stand for a long period of time. Also, cracks and adhesion failures of the film do not occur and the film has high surface hardness and excellent electrical and optical characteristics. Thus, an excellent amorphous photoconductive material can be obtained.

Though a metal organic compound containing gallium as the III group element is used in the above examples, a metal organic compound containing another III group element such as indium, aluminum, or the like may be further used together. In this case, a film with the absorbance ratio $I_{N-H}/I_{III-H}$ of 0.2 or more is an excellent amorphous material. When a plurality of III group elements is used, the absorption peak (III-H) showing the bond between the III group elements and hydrogen can be determined by summarizing the absorption peaks showing the bonds between each of III group elements and hydrogen (each peak, for example, of Ga—H, In—H, and Al—H bonds).

The metal organic compound as the raw material of the III group element may be introduced from the gas introducing pipe 130 located at a position lower than the microwave waveguide 124 instead of the gas introducing pipe 120 shown in FIG. 5. Also, gas containing Si or Mg may be further introduced into the reaction system, whereby an amorphous nitride III-V compound semiconductor of any conductive type such as n-type, p-type, or the like can be prepared.

As above-mentioned, active nitrogen and active hydrogen can be independently controlled by using the semiconductor manufacturing apparatus provided with at least two gas introducing pipes. In the case where a raw material of hydrogen and a raw material of nitrogen are not independently supplied and gas containing both hydrogen and nitrogen such as $NH_3$ is used, desirable results can be obtained by independently controlling active species of the III and V group raw materials. Accordingly, activated III and V atoms are present over the substrate in the reactor in a controlled condition and activated hydrogen converts methyl group, ethyl group, or the like into methane or ethane molecule which is inactive to the formation of a film. Therefore, an amorphous film in which carbon is almost perfectly eliminated and film defects are restrained can be formed in spite of low temperatures.

EXAMPLES

The present invention will be explained in more detail by way of examples.

Example 1

Using the semiconductor manufacturing apparatus 10 shown in FIG. 1, a washed sapphire substrate, a quartz substrate, and a Si wafer were placed on the substrate holder 20 and heated to 500° C. after evacuating the air to form a vacuum. $N_2$ gas was introduced at a flow rate of 500 sccm into a quartz pipe 24 with a diameter of 25 mm from the gas introducing pipe 26 of the first raw material activation-supply portion 14. Then, 2.45 GHz microwave set at an output of 300 W was matched by a tuner and discharged. The reflecting wave at this time was 0 W in power. While, $H_2$ gas was introduced at a flow rate of 500 sccm into the quartz pipe 24 with a diameter of 25 mm from the gas introducing pipe 26 of the second raw material activation-supply portion 16. Then, 2.45 GHz microwave was discharged at an output of 200 W. The reflecting wave was 0 W in power. In this condition, trimethylgallium (TMGa) vapor kept at room temperature was introduced at a flow rate of 2 sccm from the gas introducing pipe 30 of the first raw material activation-supply portion 14 directly through a mass-flow controller. At this time, the pressure in the reactor 12, which was measured using a Barathron vacuum gauge, was 0.2 Torr.

A film forming process was continued for one hour and the composition of the film was measured using an XPS. As a result, the ratio of Ga/N was 1.01, which accorded with the stoichiometric ratio. Also, the half width of a (0002) diffraction peak of the X ray diffraction spectrum was 50 arcsec.

Example 2

A p-type GaN film was formed using the same apparatus as in Example 1 in the same conditions as in Example 1 except that biscyclopentadienylmagnesium which was heated to 50° C. and hydrogen as a carrier gas were supplied at a flow rate of 10 sccm from the gas introducing pipe 30 of the supply portion 16.

Example 3

A n-type GaN film was formed using the same apparatus as in Example 1 in the same conditions as in Example 1 except that silane diluted (1%) by hydrogen was supplied at a flow rate of 5 sccm from the gas introducing pipe 30 of the second raw material activation supply portion 16.

Example 4

Using the same apparatus and the same substrate as in Example 1, $N_2$ gas was introduced at a flow rate of 500 sccm into a quartz pipe 24 with a diameter of 25 mm from the gas introducing pipe 26 of the first raw material activation-supply portion 14. Then, 2.45 GHz microwave set at an output of 300 W was matched by a tuner and discharged. The reflecting wave at this time was 0 W in power. While, $N_2$ gas was introduced at a flow rate of 500 sccm into a quartz pipe 24 with a diameter of 25 mm from the gas introducing pipe 26 of the second raw material activation-supply portion 16. Then, 2.45 GHz microwave was discharged at an output of 250 W. The reflecting wave was 0 W in power. In this condition, trimethylgallium vapor kept at room temperature was introduced at a flow rate of 1 sccm from the gas introducing pipe 30 of the first raw material activation-supply portion 14 and 0.5 sccm of trimethylindium vapor kept at 30° C. and $N_2$ carrier gas (at a flow rate of 50 sccm including the flow rate of trimethylindium) was introduced from the gas introducing pipe 30 of the second raw material activation-supply portion 16. At this time, the pressure in the reactor 12, which was measured using a Barathron vacuum gauge, was 0.3 Torr.

In this condition, the decomposition ratios of trimethylgallium and trimethylindium were measured using a quadrupole mass spectrometer to show that the decomposition ratios were 99.8% and 99.9% respectively.

A film forming process was continued for one hour and the composition of the film was measured using a RBS (Rutherford Back Scattering) technique. As a result, the ratio of Ga/In was 2:1, which accorded with the ratio of the introduced gases. Also, the ratio of (Ga+In)/N was 1.05, which accorded with the stoichiometric ratio. An optical gap was 2.6 eV. Also, the half width of a (0002) diffraction peak of the X ray diffraction spectrum measured for a film formed on the sapphire substrate was 60 arcsec.

Example 5

Using semiconductor manufacturing apparatus 40 shown in FIG. 2 and the same substrate as in Example 1, the substrate was heated to 500° C. after evacuating the air to form a vacuum. $N_2$ gas was introduced at a flow rate of 500 sccm into the quartz pipe 24 with a diameter of 25 mm from the gas introducing pipe 26 of the first raw material activation-supply portion 14. Then, 13.56 MHz radio frequency set at an output of 100 W was matched and discharged. The reflecting wave at this time was 0 W in power. While, $N_2$ gas was introduced at a flow rate of 500 sccm into the quartz pipe 24 with a diameter of 25 mm from the gas introducing pipe 26 of the second raw material activation-supply portion 16. Then, 2.45 GHz microwave was discharged at an output of 250 W. The reflecting wave was 0 W in power. In this condition, trimethylgallium vapor kept at room temperature was introduced at a flow rate of 1 sccm from the gas introducing pipe 30 of the first raw material activation-supply portion 14 and trimethylaluminum vapor (at a flow rate of 0.3 sccm) kept at 30° C. and $N_2$ carrier gas (at a flow rate of 100 sccm including the flow rate of trimethylaluminum) were introduced from the gas introducing pipe 30 of the second raw material activation-supply portion 16. At this time, the pressure in the reactor 12, which was measured using a Barathron vacuum gauge, was 0.3 Torr.

A film forming process was continued for one hour and the composition of the film was measured using a RBS. As a result, the ratio of Ga/Al was 3.2:1, which accorded with the ratio of the introduced gases. Also, the ratio of (Ga+Al)/N was 1.05, which accorded with the stoichiometric ratio.

Example 6

Using the semiconductor manufacturing apparatus 50 shown in FIG. 3 and the same substrate as in Example 1, the substrate was heated to 500° C. after evacuating the air to form a vacuum. $N_2$ gas was introduced at a flow rate of 500 sccm into the quartz pipe 24 with a diameter of 25 mm from the gas introducing pipe 26 of the first raw material activation-supply portion 14. Then, 2.45 GHz microwave set at an output of 300 W was matched and discharged. The reflecting wave at this time was 0 W in power. While, $N_2$ gas was introduced at a flow rate of 800 sccm into the quartz pipe 24 with a diameter of 25 mm from the gas introducing pipe 26 of the second raw material activation-supply portion 16. Then, 2.45 GHz microwave was discharged at an output of 200 W. The reflecting wave was 0 W in power. The substrate was heated to 600° C. In this condition, trimethylgallium vapor kept at room temperature was introduced at a flow rate of 1 sccm from the gas introducing pipe 30 of the first raw material activation-supply portion 14 and trimethylindium vapor (at a flow rate of 1.0 sccm) kept at 30° C. and $N_2$ carrier gas (at a flow rate of 20 sccm including the flow rate of trimethylindium) were introduced from the gas introducing pipe 30 of the second raw material activation-supply portion 16. At this time, the pressure in the reactor 72, which was measured using a Barathron vacuum gauge, was 0.2 Torr.

Firstly, a film of GaN was formed for one minute in the first space 56. Then, the substrate, the substrate holder 62, and the heater 64 were moved to the second space 58 and a film of InN was formed for one minute. These procedures were repeated ten times to form a multilayer film consisting of 20 layers. Time for moving the substrate was about 2 seconds. There was no large change in the light emitting condition of the remote plasma before and after the movement. The composition of the film and the distribution in the direction of the thickness of the film were measured by a XPS, RBS, and secondary ion mass spectrometer. As a result, it was confirmed that each layer having 10 nm thickness and GaN and InN in a stoichiometric ratio was separated by a clear boundary.

Example 7

Using the semiconductor manufacturing apparatus 110 shown in FIG. 5, a washed aluminum substrate, a quartz substrate, and a Si wafer were placed on the substrate holder 116 and heated to 250° C. after evacuating the air to form a vacuum.

$N_2$ gas was introduced at a flow rate of 500 sccm into a quartz pipe with a diameter of 25 mm from the gas introducing pipe 120. Then, 2.45 GHz microwave was set at an output of 200 W, matched by a tuner, and discharged in the microwave waveguide 124. The reflecting wave at this time was 0 W in power. $H_2$ gas was introduced at a flow rate of 200 sccm into a quartz pipe with a diameter of 30 mm from the gas introducing pipe 122. Then, using the radio frequency coil 126, 13.56 MHz radio frequency was discharged at an output of 100 W. The reflecting wave was 0 W in power. In this condition, trimethylgallium (TMGa) vapor kept at room temperature was introduced at a flow rate of 1 sccm from the third gas introducing pipe 130 through a mass-flow controller. At this time, the reaction pressure, which was measured using a Barathron vacuum gauge, was 0.2 Torr. A film forming process was carried out in this condition to obtain an amorphous material. The composition of the film was measured using a XPS. As a result, it was confirmed that the ratio of Ga/N was 1.1, which almost accorded with the stoichiometric ratio. The optical gap of the film was 3.5 eV and the film was colorless transparent.

Figure 7:
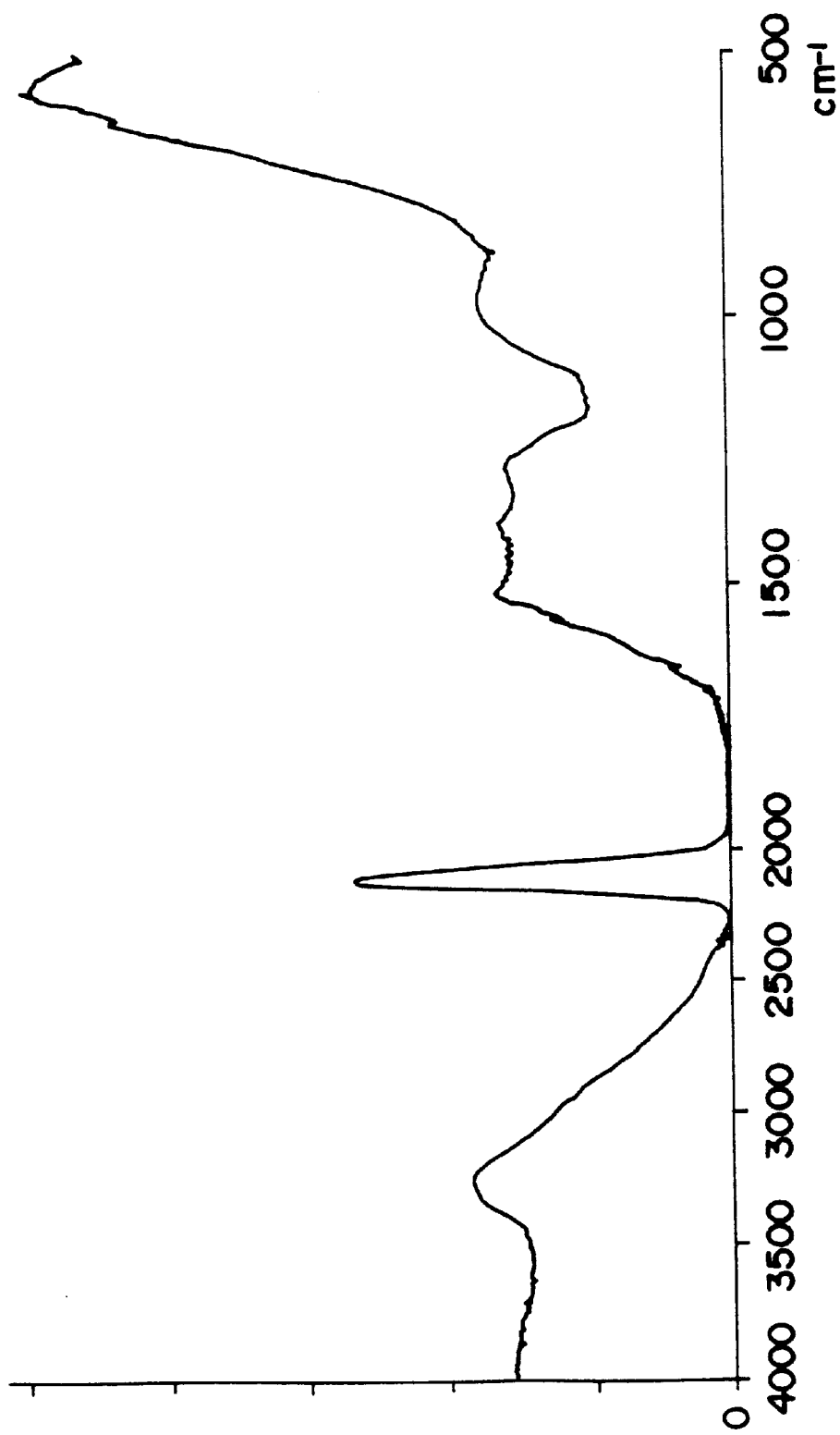
FIG. 7 is a graph showing the IR spectrum of the amorphous material of Example 7 directly after a film is formed.

FIG. 7 shows the result of the IR spectrum measured for the amorphous material prepared in Example 7. No clear peak was found in the X ray diffraction spectrum to show that the resultant product was amorphous. The IR spectrum of this GaN film was measured one week, one month, and two months after the film was formed and, as a result, no change in the spectrum was observed.

The peaks in the vicinities of 3230 cm$^{-1}$, 2950 cm$^{-1}$, and 2100 cm$^{-1}$ were corrected in terms of the base line correction to calculate each absorbance and thereby to calculate $I_{3230}/I_{2950}$ and $I_{3230}/I_{2100}$, which were 17 and 0.28 respectively.

Example 8

A film of an amorphous material was formed using the same apparatus and in the same manner as in Example 7 except that the flow rate of $N_2$ gas was changed to 900 sccm and TMGa was introduced from the gas introducing pipe 128 located at the downstream of the radio frequency coil 126.

The IR spectrum of the amorphous material prepared in Example 8 was measured. No clear peak was found in the X-ray diffraction spectrum to show that the resultant product was amorphous. The IR spectrum of this GaN film was measured one week, one month, and two months after the film was formed and, as a result, no change in the spectrum was observed. Also, there was no change in the outward appearance of the amorphous GaN film two months after the film was formed.

The peaks in the vicinities of 3230 cm$^{-1}$, 2950 cm$^{-1}$, and 2100 cm$^{-1}$ were corrected in terms of the base line correction to calculate each absorbance and thereby to calculate $I_{3230}/I_{2950}$ and $I_{3230}/I_{2100}$, which were 5.4 and 0.22 respectively.

Example 9

An amorphous material was obtained by forming a film in the same condition as in Example 7 except that the microwave was set at 250 W.

The IR spectrum of the amorphous material prepared in Example 9 was measured. No clear peak was found in the x-ray ray diffraction spectrum to show that the resultant product was amorphous. The IR spectrum of this GaN film was measured one week, one month, and two months after the film was formed and, as a result, no change in the spectrum was observed. Also, there was no change in the outward appearance of the amorphous GaN film two months after the film was formed.

The peaks in the vicinities of 3230 cm$^{-1}$, 2950 cm$^{-1}$, and 2100 cm$^{-1}$ were corrected in terms of the base line correction to calculate each absorbance and thereby to calculate $I_{3230}/I_{2950}$ and $I_{3230}/I_{2100}$, which were 5.6 and 0.24 respectively.

Example 10

An amorphous material was obtained by forming a film in the same condition as in Example 7 except that the microwave was set at 300 W.

The IR spectrum of the amorphous material prepared in Example 10 was measured. No clear peak was found in the x-ray diffraction spectrum to show that the resultant product was amorphous. The IR spectrum of this GaN film was measured one week, one month, and two months after the film was formed and, as a result, no change in the spectrum was observed. Also, there was no change in the outward appearance of the amorphous GaN film two months after the film was formed.

The peaks in the vicinities of 3230 cm$^{-1}$, 2950 cm$^{-1}$, and 2100 cm$^{-1}$ were corrected in terms of the base line correction to calculate each absorbance and thereby to calculate $I_{3230}/I_{2950}$ and $I_{3230}/I_{2100}$, which were 9.0 and 0.24 respectively.

Comparative Example 1

A film of an amorphous material was formed using the same apparatus and in the same manner as in Example 7 except that no $H_2$ gas was used, radio frequency power was not supplied, TMGa was introduced from the gas introducing pipe 128, $N_2$ gas was introduced at a flow rate of 300 sccm, the microwave with an output of 150 W was discharged and TMGa was introduced at a flow rate of 3 sccm. In these conditions, a film was formed to obtain an amorphous material.

Figure 8:
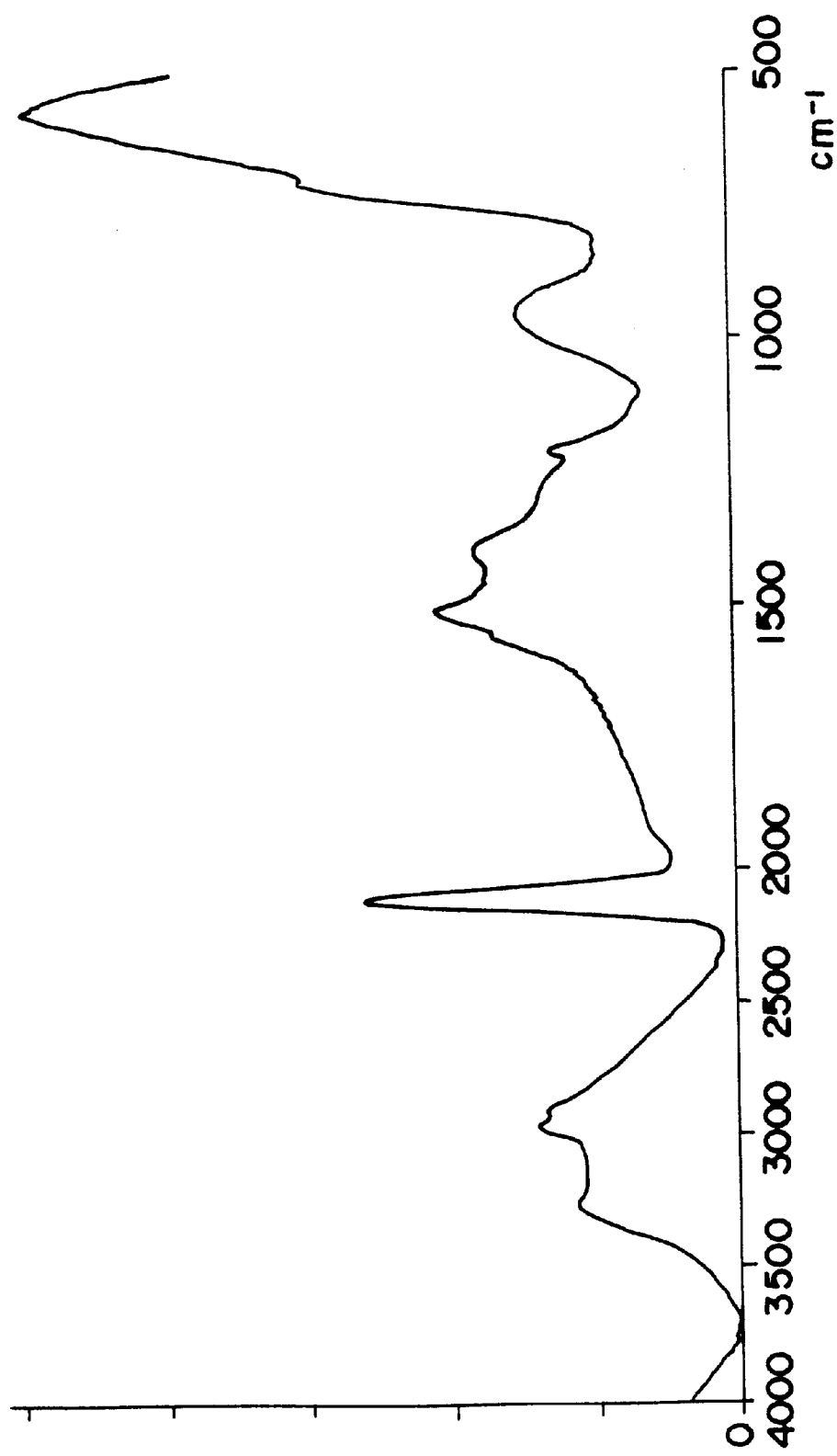
FIG. 8 is a graph showing the IR spectrum of the amorphous material of Comparative Example 1 directly after a film is formed.
Figure 9:
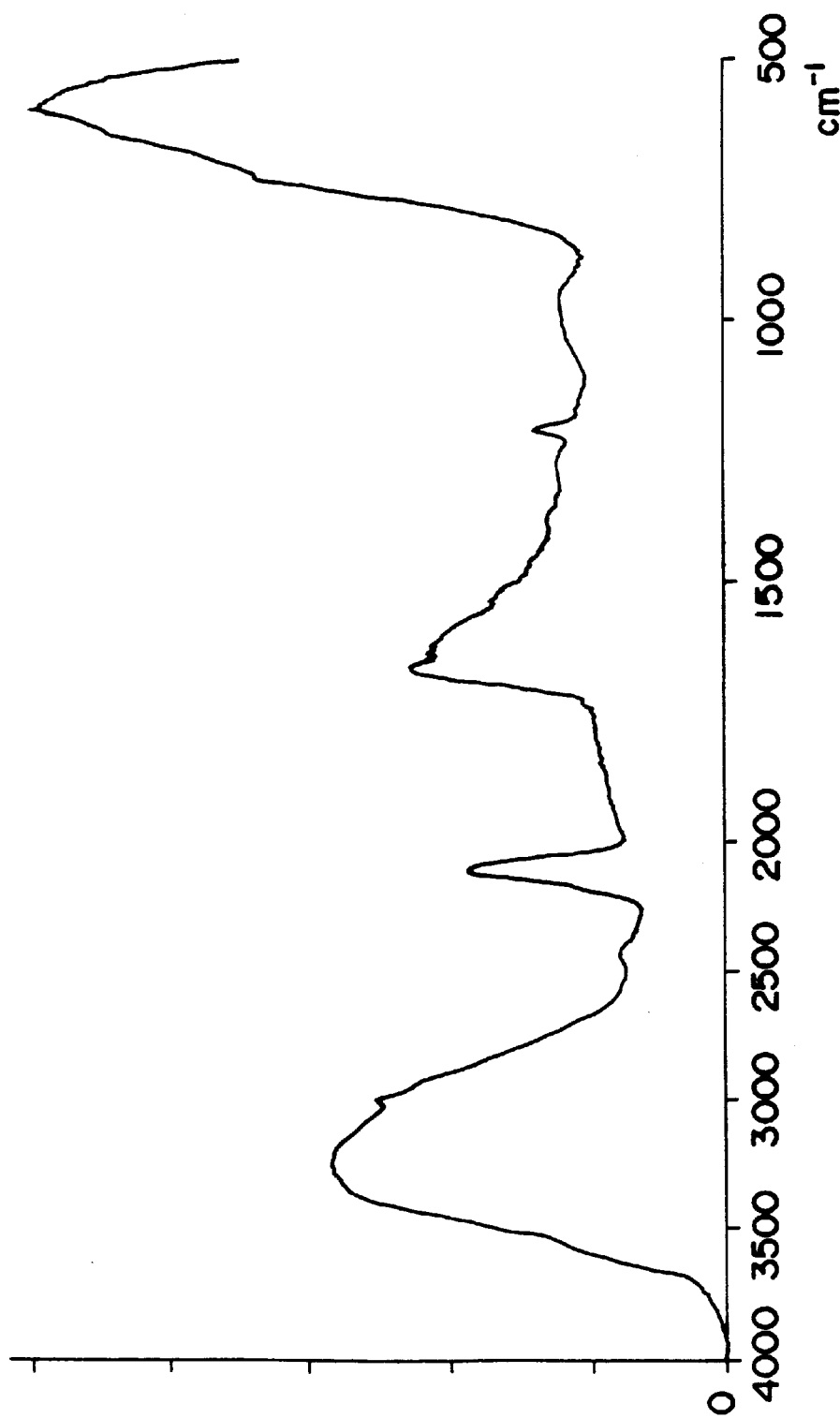
FIG. 9 is a graph showing the IR spectrum of the amorphous material of Comparative Example 1 two weeks after a film is formed.

The film was light brown directly after formation. FIG. 8 shows the IR spectrum of the amorphous material directly after film formation. The IR spectrum of this film was measured one week and two weeks after the film was formed and, as a result, there was a great change in the spectrum. FIG. 9 shows the IR spectrum after two weeks. The intensities relating to the Ga-hydrogen bond and carbon-hydrogen bond in the spectrum of FIG. 9 decreased compared with the IR spectrum of FIG. 8. This indicates that the amount of hydrogen bound with Ga or carbon in the amorphous material was decreased by oxidation. Also, this film was observed two weeks after the film was formed. The color of the film changed to colorless transparent and the occurrence of micro-cracks was observed. In the IR spectrum directly after the film was formed, the peaks in the vicinities of 3230 cm$^{-1}$, 2950 cm$^{-1}$, and 2100 cm$^{-1}$ were corrected in terms of the base line correction to determine each absorbance and thereby to determine $I_{3230}/I_{2950}$ and $I_{3230}/I_{2100}$, which were 0.8 and 0.1 respectively.

Comparative Example 2

An amorphous material was prepared by forming a film in the same conditions as in Comparative Example 1 except that N$_2$ gas was introduced at a flow rate of 500 sccm.

The film was light brown directly after formation. The IR spectrum of the amorphous material was measured directly after the film was formed. Also, the IR spectrum of this film was measured one week and two weeks after the film was formed and, as a result, there was a great change in the spectrum similarly to Comparative Example 1. Also, the color of the film changed to colorless transparent and the occurrence of micro-cracks was observed two weeks after the film was formed. In the IR spectrum directly after the film was formed, the peaks in the vicinities of 3230 cm$^{-1}$, 2950 cm$^{-1}$, and 2100 cm$^{-1}$ were corrected in terms of the base line correction to determine each absorbance and thereby to determine $I_{3230}/I_{2950}$ and $I_{3230}/I_{2100}$, which were 1.9 and 0.09 respectively.

Comparative Example 3

An amorphous material was prepared by forming a film in the same conditions as in Comparative Example 1 except that N$_2$ gas was introduced at a flow rate of 500 sccm, the microwave with an output of 200 W was discharged, H$_2$ gas was introduced at a flow rate of 200 sccm, radio frequency were not supplied, and TMGa was introduced from the gas introducing pipe 130.

The film formed was light brown directly after formation. The IR spectrum of the amorphous material was measured directly after the film was formed. Also, the IR spectrum of this film was measured one week and two weeks after the film was formed. Small changes in the spectrum were seen. Also, the film became colorless transparent, the adhesion between the film and the substrate was reduced, and it was observed that the film was partially peeled off two weeks after the film was formed. In the IR spectrum directly after the film was formed, the peaks in the vicinities of 3230 cm$^{-1}$, 2950 cm$^{-1}$, and 2100 cm$^{-1}$ were corrected in terms of the base line correction to calculate each absorbance and thereby to calculate $I_{3230}/I_{2950}$ and $I_{3230}/I_{2100}$, which were 1.5 and 0.11 respectively.

For these amorphous materials of Examples 7 to 10 and Comparative Examples, the results of $I_{3230}/I_{2950}$, $I_{3230}/I_{2100}$, changes in characteristics of the film and in the IR spectrum with time, and the ratio of light to dark conductivity relating to the photoconductivity under irradiation from a xenon lamp are shown in Table 1.

TABLE 1

| | Film forming condition | | | | | | Characteristics of amorphous material | | | | | |
|---|---|---|---|---|---|---|---|---|---|---|---|---|
| | | | | Output of high fre-quency wave | III group element | | Ratio of absorbance | | Change with time | | | Photo-conductivity |
| | Flow rate of N$_2$ gas (sccm) | Output of micro-wave | Flow rate of H$_2$ gas (sccm) | | Use gas | Flow rate (sccm) | Intro-ducing pipe | $I_{N-H}/I_{C-H}$ | $I_{N-H}/I_{Ga-H}$ | IR spec-trum | Color of film | Outward appear-ance | Ratio of light to dark conductivity |
| Example 7 | 500 | 200 W | 200 | 100 W | TMGa | 1 | 130 | 17 | 0.28 | No change | No change | No change | 10$^4$ |
| Example 8 | 900 | 200 W | 200 | 100 W | TMGa | 1 | 128 | 5.2 | 0.22 | No change | No change | No change | 10$^2$ |
| Example 9 | 500 | 250 W | 200 | 100 W | TMGa | 1 | 130 | 5.6 | 0.24 | No change | No change | No change | 10$^2$ |
| Example 10 | 500 | 300 W | 200 | 100 W | TMGa | 1 | 130 | 9.0 | 0.24 | No change | No change | No change | 10$^3$ |
| Comparative Example 1 | 300 | 150 W | — | — | TMGa | 3 | 128 | 0.8 | 0.1 | Large change | Some change | Micro-cracks occurred | 1.1 |
| Comparative Example 2 | 500 | 150 W | — | — | TMGa | 3 | 128 | 1.9 | 0.09 | Large change | Some change | Miro-cracks occurred | 1.5 |
| Comparative Example 3 | 500 | 200 W | 200 | 0 W | TMGa | 3 | 130 | 1.5 | 0.11 | Some change | Some change | Adhesion decreased | 1.4 |

As is clear from Table 1, the amorphous materials prepared in Examples 7 to 10, in which the ratios of absorbance $I_{N-H}/I_{C-H}$ and $I_{N-H}/I_{III-H}$ are within the above defined range in the present invention, form a uniform and transparent film, are excellent in photoconductivity, change little with time and are excellent in environmentally resistant characteristics. On the other hand, the amorphous materials prepared in Comparative Examples 1 to 3, in which the ratios of absorbance $I_{N-H}/I_{C-H}$ and $I_{N-H}/I_{III-H}$ fall outside of the above defined range of the present invention, are insufficient in photoconductivity, change color in such a short period as 1 to 2 weeks, show microcracks, lose adhesion with the substrate, and are inferior in stability.

The preferred conditions for manufacturing the amorphous material of the present invention can be selected based on various relations to raw materials and operating conditions. However, it is apparent from the results of the above Examples 7 to 10 and Comparative Examples that the following conditions are preferred. Specifically, it is desirable that the feed volume of $N_2$ gas be large, that the microwave energy applied to the $N_2$ gas be strong, that the feed volume of the III group element is small, and that hydrogen is supplied and activated by radio frequency, and the like.

What is claimed is:

1. An amorphous material comprising at least hydrogen, carbon, a III group element, and nitrogen,
    wherein, in an infrared absorption spectrum measured of the amorphous material, the ratio of the absorbance, $I_{N-H}$, at the absorption peak indicating the bond (N—H) between nitrogen and hydrogen to the absorbance, $I_{C-H}$, at the absorption peak indicating the bond (C—H) between carbon and hydrogen is 2 or more; and
    the ratio of the absorbance, $I_{N-H}$, at the absorption peak indicating the bond (N—H) between nitrogen and hydrogen to the absorbance, $I_{III-H}$, at the absorption peak indicating the bond (III-H) between the III group element and hydrogen is 0.2 or more.

2. An amorphous material according to claim 1, wherein said III group element is gallium, and
    the ratio of the absorbance $I_{3230}$ at the absorption peak in the vicinity of 3230 cm$^{-1}$ to the absorbance $I_{2950}$ at the absorption peak in the vicinity of 2950 cm$^{-1}$ in the infrared absorption spectrum for said amorphous material is 2 or more; and
    the ratio of the absorbance $I_{3230}$ at the absorption peak in the vicinity of 3230 cm$^{-1}$ to the absorbance $I_{2100}$ at the absorption peak in the vicinity of 2100 cm$^{-1}$ in the infrared absorption spectrum is 0.2 or more.

3. An amorphous material according to claim 1, wherein the III group element is provided by a III group metal organic compound.

4. An amorphous material according to claim 1, wherein the nitrogen is provided by nitrogen gas.

5. An amorphous material according to claim 2, wherein said amorphous material is hydrogenated amorphous gallium nitride.

6. An amorphous material according to claim 5, wherein said amorphous material consists essentially of hydrogen atoms, gallium atoms, and nitrogen atoms.

7. An amorphous material according to claim 1 wherein said amorphous material includes a microcrystalline portion.

8. A process for manufacturing an amorphous material, comprising:
    generating a first plasma of nitrogen from a nitrogen source;
    generating a second plasma of an auxiliary material for activating a metal organic compound containing a III group element separately from and at the same time as generating the first plasma;
    adding the vaporized metal organic compound and the second plasma of the auxiliary material to the first plasma of nitrogen; and
    forming a film of the amorphous material comprising at least hydrogen, carbon, a III group element, and nitrogen;
    wherein, in an infrared absorption spectrum measured of the amorphous material, the ratio of the absorbance, $I_{N-H}$, at the absorption peak indicating the bond (N—H) between nitrogen and hydrogen to the absorbance, $I_{C-H}$, at the absorption peak indicating the bond (C—H) between carbon and hydrogen is 2 or more; and
    the ratio of the absorbance, $I_{N-H}$, at the absorption peak indicating the bond (N—H) between nitrogen and hydrogen to the absorbance, $I_{III-H}$, at the absorption peak indicating the bond (III-H) between a III group element and hydrogen is 0.2 or more.

9. The process according to claim 8, wherein the III group element is gallium, and
    the ratio of the absorbance $I_{3230}$ at the absorption peak in the vicinity of 3230 cm$^{-1}$ to the absorbance $I_{2950}$ at the absorption peak in the vicinity of 2950 cm$^{-1}$ in the infrared absorption spectrum for the amorphous material is 2 or more; and
    the ratio of the absorbance $I_{3230}$ at the absorption peak in the vicinity of 3230 cm$^{-1}$ to the absorbance $I_{2100}$ at the absorption peak in the vicinity of 2100 cm$^{-1}$ in the infrared absorption spectrum is 0.2 or more.

10. The process according to claim 9, wherein the amorphous material is hydrogenated amorphous gallium nitride.

11. The process according to claim 9, wherein the amorphous material consists essentially of hydrogen, gallium, and nitrogen.

* * * * *